(12) United States Patent
Mori

(10) Patent No.: US 6,240,021 B1
(45) Date of Patent: *May 29, 2001

(54) NONVOLATILE SEMICONDUCTOR MEMORY DEVICE IMPROVED IN READOUT OPERATION

(75) Inventor: Seiichi Mori, Tokyo (JP)

(73) Assignee: Kabushiki Kaisha Toshiba, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/249,668

(22) Filed: Feb. 12, 1999

(30) Foreign Application Priority Data

Feb. 16, 1998 (JP) .................................. 10-033036

(51) Int. Cl.[7] ..................................... G11C 11/34
(52) U.S. Cl. ............................ 365/185.27; 365/185.18
(58) Field of Search ........................ 365/185.27, 185.18

(56) References Cited

U.S. PATENT DOCUMENTS 5,293,331 * 3/1994 Hart et al. ............................ 365/185
5,657,271    8/1997 Mori .
5,828,602 * 10/1998 Wong ............................... 365/185.2

FOREIGN PATENT DOCUMENTS 3-88199    4/1991 (JP) ............................. G11C/16/06

* cited by examiner

Primary Examiner—David Nelms
Assistant Examiner—M. Tran
(74) Attorney, Agent, or Firm—Hogan & Hartson, LLP

(57) ABSTRACT

In a nonvolatile semiconductor memory device using a stacked gate structure type transistor as a memory cell, an N-type well is formed on the surface of a P-type silicon substrate, and a plurality of P-type wells are formed on the surface of the N-type well. The P-type wells are electrically isolated by trenches. A plurality of memory cells are formed on each of the P-type wells, and a P-type contact layer, which is connected to a bias circuit, is formed thereon. When information is read, a reverse bias voltage is selectively applied by the bias circuit between the P-type silicon substrate and the P-type well not including an N-type source diffusion layer of a selected memory cell. If, therefore, the threshold voltages of non-selected memory cells are heightened, the leak current flowing through the non-selected memory cells connected to the same wiring as that connected to the selected memory cell, can be reduced in the read mode even though the threshold voltages of the memory cells are set to a low value in the erase mode.

16 Claims, 9 Drawing Sheets

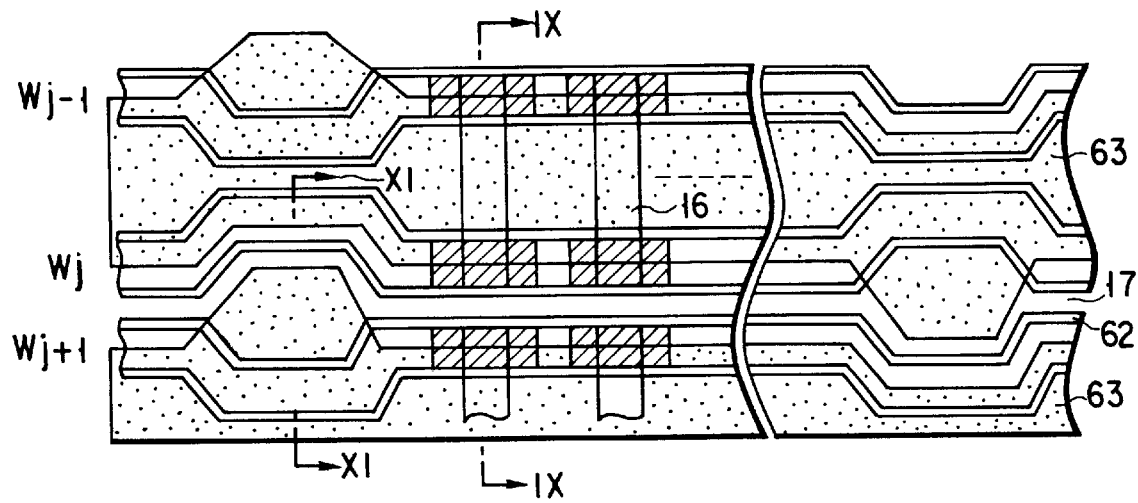
F I G. 10A
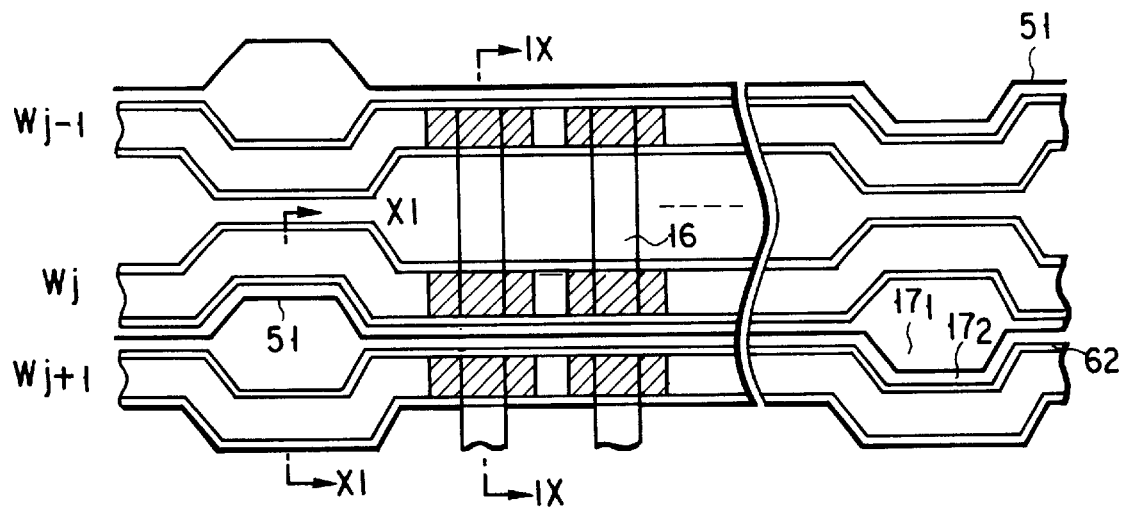
F I G. 10B

NONVOLATILE SEMICONDUCTOR MEMORY DEVICE IMPROVED IN READOUT OPERATION

BACKGROUND OF THE INVENTION

The present invention relates to a nonvolatile semiconductor memory device and, more specifically, to a nonvolatile semiconductor memory device using a stacked gate structure type transistor as a memory cell.

Conventionally a magnetic disk apparatus has been widely used as a nonvolatile memory device of an information processing apparatus. However, the magnetic disk apparatus has the following drawbacks. The apparatus is susceptible to a shock because it has a high-precision mechanical driving mechanism. Furthermore, the apparatus is not accessible to a storage memory at high speed because the access is done mechanically.

To overcome the above drawbacks, nonvolatile semiconductor memory devices having no mechanical driving mechanism have recently been developed as memory devices capable of high-speed access. A NOR type flash memory is known as one nonvolatile semiconductor memory device. The memory cell array of the flash memory is constituted of a plurality of stacked gate structure (floating gate electrode/control gate electrode) type transistors (memory cells) arranged in matrix.

When "0" information is written to the above flash memory, electrons are injected from a drain diffusion layer of a selected memory cell into a floating gate electrode thereof to increase a threshold voltage of the memory cell.

When "0" information is erased from the flash memory, a bias voltage is applied to the source diffusion layers of all memory cells to extract electrons from the floating gate electrodes, or a negative voltage is applied to the control gate electrodes, and electrons are extracted from the floating gate electrodes and applied to the entire surface of the channels to decrease a threshold voltage. This state is defined as "1" information.

In general, the erase speed varies from memory cell to memory cell. The electrons are therefore usually extracted until the threshold voltage of a memory cell whose erase speed is the lowest becomes not higher than a predetermined value. As a result, the threshold voltages of the memory cells after the erase operation have a distribution with a certain width.

When information is read out of the flash memory, the gate electrodes of non-selected memory cells are grounded to turn off the non-selected memory cells, and a voltage having a predetermined level is applied to the gate electrode of a selected memory cell.

Information ("1" or "0") is determined according to whether a selected memory cell is turned on or off. When a memory cell is turned on, no information is written thereto and its threshold voltage is low. When a memory cell is turned off, information is written thereto and its threshold voltage is high.

In order to raise the read speed of memory cells, it is important to cause a large amount of current (on-current) to flow through memory cells to be turned on and reduce a leak current through memory cells to be turned off and a non-selected memory cell.

In order to increase the on-current, for example, it is necessary to make the threshold voltage of the memory cell as low as possible in the erase mode. If, however, the threshold voltage is too low, a leak current flows through a non-selected memory cells connected to a bit line selected in the read mode, even though its gate voltage corresponds to a ground potential.

As has been described above, the erase speed varies from memory cell to memory cell. For this reason, if an erase operation is performed until the memory cell whose erase speed is the lowest has a considerably low threshold voltage, the threshold voltage of a memory cell whose erase speed is high becomes 0V or lower (over-erasure). A large amount of leak current will therefore flow through a non-selected memory cell which is connected to a bit line selected in the read mode and whose erase speed is high.

FIG. 1 shows an example of distribution of threshold voltages of memory cells connected to one bit line after information is erased from these memory cells. In FIG. 1, Vthmax represents the threshold voltage of a memory cell the erase speed of which is the lowest, and Vthmin represents that of a memory cell the erase speed of which is the highest. Further, the solid line indicates a memory cell array of 1024 memory cells, and the broken line shows that of 64 memory cells.

1000 to 2000 memory cells are usually connected to one bit line. Recently a low-voltage operation and a low-power-consumption operation have strongly been required for nonvolatile semiconductor memory devices used in electronic equipment such as a portable information terminal.

To enable the low-voltage operation, a gate voltage VG has to lower as much as possible in the read mode. In this case, too, in order to obtain a considerable amount of read current α, it is important to decrease the threshold voltage of a memory cell whose erase operation is completed and set a difference β between the gate voltage VG and threshold voltage Vthmax to be not less than a fixed value. In other words, the threshold voltage Vthmax has to be lowered in association with a decrease in gate voltage VG. If, however, the threshold voltage Vthmax is lowered, the threshold voltage Vthmin is lowered accordingly and an over-erasure is easy to occur, thereby causing the above-described problem that a large amount of leak current flows through non-selected memory cells connected to a bit line selected in the read mode.

As a method of resolving the above problem, it can be thought that a variation in erase speed among the memory cells is lessened and a difference between threshold voltages Vthmax and Vthmin is narrowed. However, the method is not the ultimate solution to the problem because the variation in erase speed cannot be avoided due to variations in precision of processing and current/voltage characteristics of an oxide film.

Furthermore, in order to secure a withstanding voltage between source and drain diffusion layers of a memory cell which decreases in accordance with miniaturization, a pocket region whose concentration is higher than that of a substrate has recently been formed by injecting impurities into around the drain diffusion layer, the conductivity type of the impurities being different from that of these diffusion layers. If, however, such a pocket region is formed, the following problem will arise. The parasitic junction capacitance of the drain diffusion layer increases and accordingly access time in the read mode is lengthened.

The following problem will also arise. If the gate length of a memory cell is decreased by miniaturization without forming a pocket region, the impurity concentration of the substrate need to increase and thus the increase in parasitic junction capacitance cannot be avoided.

BRIEF SUMMARY OF THE INVENTION

The present invention has been developed in order to resolve the above problems and one object thereof is to provide a nonvolatile semiconductor memory device in which even though the threshold voltage of a memory cell is set low in an erase mode, an amount of leak current flowing through a memory cell connected to the same wiring as that of a control gate electrode of another memory cell from which information is to be read, can be reduced in the read mode.

Another object is to provide a nonvolatile semiconductor memory device capable of decreasing the parasitic junction capacitance of a drain diffusion layer and shortening access time (increasing access speed) even when a pocket region whose concentration is higher than that of a semiconductor substrate is formed or when the impurity concentration of the substrate is increased.

To attain the above objects, according to a first aspect of the present invention, there is provided a nonvolatile semiconductor memory device comprising:

a semiconductor substrate;

a plurality of electrically erasable memory cells formed on the semiconductor substrate in matrix, and each including a source electrode and a drain electrode and having a stacked gate structure in which a control gate electrode and a floating gate electrode are formed one on another;

a first wiring group including a plurality of first wirings each connected in common to corresponding control gate electrodes of the memory cells;

a second wiring group including a plurality of second wirings each connected in common to corresponding drain electrodes of the memory cells;

a well group including a plurality of wells each having source electrodes of the memory cells, the wells having a conductivity type which is opposite to that of each of source and drain electrodes; and a bias circuit for selectively applying a reverse bias voltage between the semiconductor substrate and a well, which excludes a source electrode of a memory cell from which information is to be read and includes source electrodes of other memory cells sharing the second wiring together with the memory cell, in a read operation for reading the information from the memory cell by applying a gate voltage of a predetermined level to a first wiring connected to the control gate of the memory cell to make the memory cell in a selective state.

According to a second aspect of the present invention, there is provided a nonvolatile semiconductor memory device comprising:

a semiconductor substrate;

a plurality of electrically erasable memory cells formed on the semiconductor substrate in matrix, and each including a source electrode and a drain electrode and having a stacked gate structure in which a control gate electrode and a floating gate electrode are formed one on another;

a first wiring group including a plurality of first wirings each connected in common to corresponding control gate electrodes of the memory cells;

a second wiring group including a plurality of second wirings each connected in common to corresponding drain electrodes of the memory cells;

a third wiring group including a plurality of third wirings each connected in common to corresponding source electrodes of the memory cells; and a bias circuit for selectively applying a reverse bias voltage to the semiconductor substrate through a third wiring, which is not connected to a source electrode of a memory cell from which information is to be read but connected to source electrodes of other memory cells sharing the second wiring together with the memory cell, in a read operation for reading the information from the memory cell by applying a gate voltage of a predetermined level to a first wiring connected to the control gate of the memory cell to make the memory cell in a selective state.

According to a third aspect of the present invention, there is provided a nonvolatile semiconductor memory device comprising:

a semiconductor substrate;

a plurality of electrically erasable memory cells formed on the semiconductor substrate in matrix, and each including a source electrode and a drain electrode and having a stacked gate structure in which a control gate electrode and a floating gate electrode are formed one on another;

a first wiring group including a plurality of first wirings each connected in common to corresponding control gate electrodes of the memory cells;

a second wiring group including a plurality of second wirings each connected in common to corresponding drain electrodes of the memory cells; and a bias circuit for applying the same voltage as that of the semiconductor substrate to a source electrode of a memory cell from which information is to be read and applying a voltage for reversely biasing the source electrode and the semiconductor substrate, to the memory cell and other memory cells having the second wirings in a read operation for reading the information from the memory cell by applying a gate voltage of a predetermined level to a first wiring connected to the control gate of the memory cell to make the memory cell in a selective state.

In the nonvolatile semiconductor memory device so constituted, the threshold voltages of non-selected memory cells can be heightened by the substrate bias effect in the read mode. Thus, even though the threshold voltages of memory cells are set low in the erase mode, the leak current flowing through the non-selected memory cells connected to the same second wiring as that connected to a selected memory cell, can be reduced.

Since, in particular, a reverse bias between drain electrodes and wells can be increased, a junction capacitance between a drain electrode and a well in a non-selected memory cell can be reduced, and a parasitic capacitance of the second wiring can be decreased.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 10A and 10B are schematic plan views illustrating a separation process of a source diffusion layer in a memory cell array of the nonvolatile semiconductor memory device shown in FIG. 8.

DETAILED DESCRIPTION OF THE INVENTION

Embodiments of the present invention will now be described with reference to the accompanying drawings.
(First Embodiment)

Figure 2:
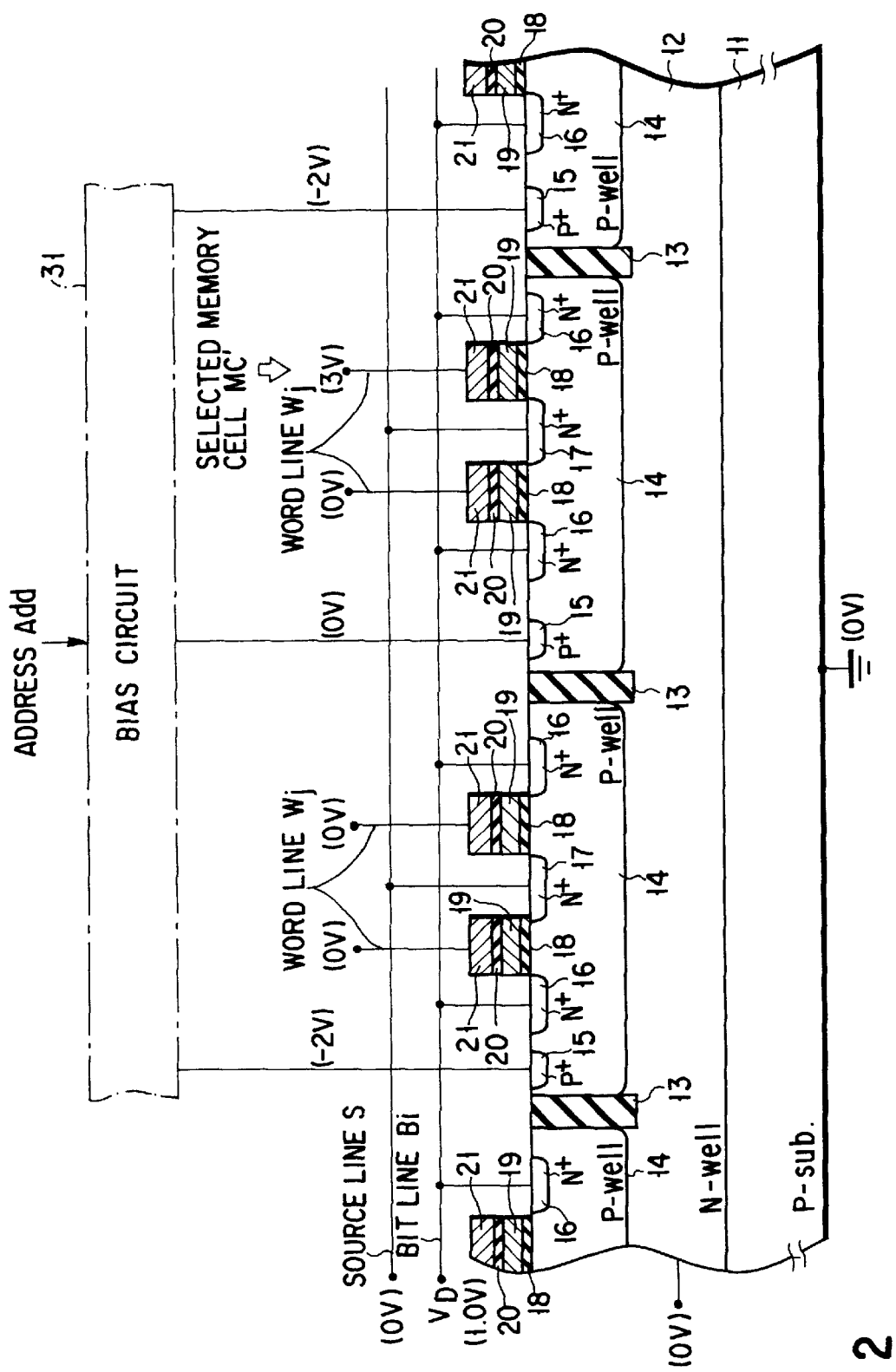
FIG. 2 is a schematic view showing the constitution of the main part of a nonvolatile semiconductor memory device according to a first embodiment of the present invention.

FIG. 2 schematically shows the constitution of the main part of a nonvolatile semiconductor memory device according to a first embodiment of the present invention. FIG. 2 is a cross-sectional view taken in a column (bit line) direction and showing the constitution of a memory cell array of the device.

An N-type well (N-well) 12 is formed on the surface of a P-type silicon substrate (P-sub.) 11, and a plurality of P-type wells (P-wells) 14, which are electrically isolated from each other by trenches 13 each embedded with an insulation film, are formed on the surface of the N-type well 12. These P-type wells 14 are obtained by forming a large P-type well layer on the surface of the N-type well 12 and electrically isolating it into a plurality of regions by the respective trenches 13. It is favorable that the number of regions (P-type wells 14) be 10 or more in order to sufficiently achieve the advantage of the present invention.

A P-type contact layer 15 of high impurity concentration, connected to a bias circuit 31 (which will be described later in detail), is selectively formed in the surface region of each of the p-type wells 14. Moreover, a plurality of stacked gate structure transistors serving as memory cells, are formed in each of the P-type wells 14. For simplification, FIG. 2 illustrates only two memory cells formed in one of the P-type wells 14; however, one P-type well usually includes 16 or 64 memory cells.

Each of the memory cells is constituted of an N-type drain diffusion layer (drain electrode) 16 of high impurity concentration selectively formed in the surface region of the P-type well 14, an N-type source diffusion layer (source electrode) 17 of high impurity concentration selectively formed in the surface region of the P-type well 14, and a gate electrode section of a two-layered (stacked) gate structure formed on the P-type well 14 and interposed between the layers 16 and 17.

The gate electrode section includes a gate insulation film (tunnel oxide film) 18, a floating gate electrode 19 as an electric charge storage portion, a gate-to-electrode insulation film 20 and a control gate electrode 21 which are laminated in the order designated. Though not shown in FIG. 2, the top of the gate electrode section is covered with a cap insulation film, and adjacent two gate electrode sections are electrically insulated from each other by an interlayer insulation film.

Adjacent two memory cells in one P-type well 14 share one N-type source diffusion layer 17, and the N-type source diffusion layer 17 extends in a row direction perpendicular to the column direction and shared with all the memory cells arranged along the row direction.

The N-type drain diffusion layers 16 are connected to the same metal wiring layer (referred to as bit line $B_i$ hereinafter). Each P-type well 14 includes a plurality of control gate electrode groups and each of the groups is constituted of a plurality of control gate electrodes 21. The control gate electrode groups are connected to their respectively different wiring layers (referred to as word line $W_j$ hereinafter) perpendicular to the bit line $B_i$. Moreover, the N-type source diffusion layers 17 are all connected to another wiring layer (referred to as source line S hereinafter) which is parallel with the bit line $B_i$ in the column direction.

Figure 3:
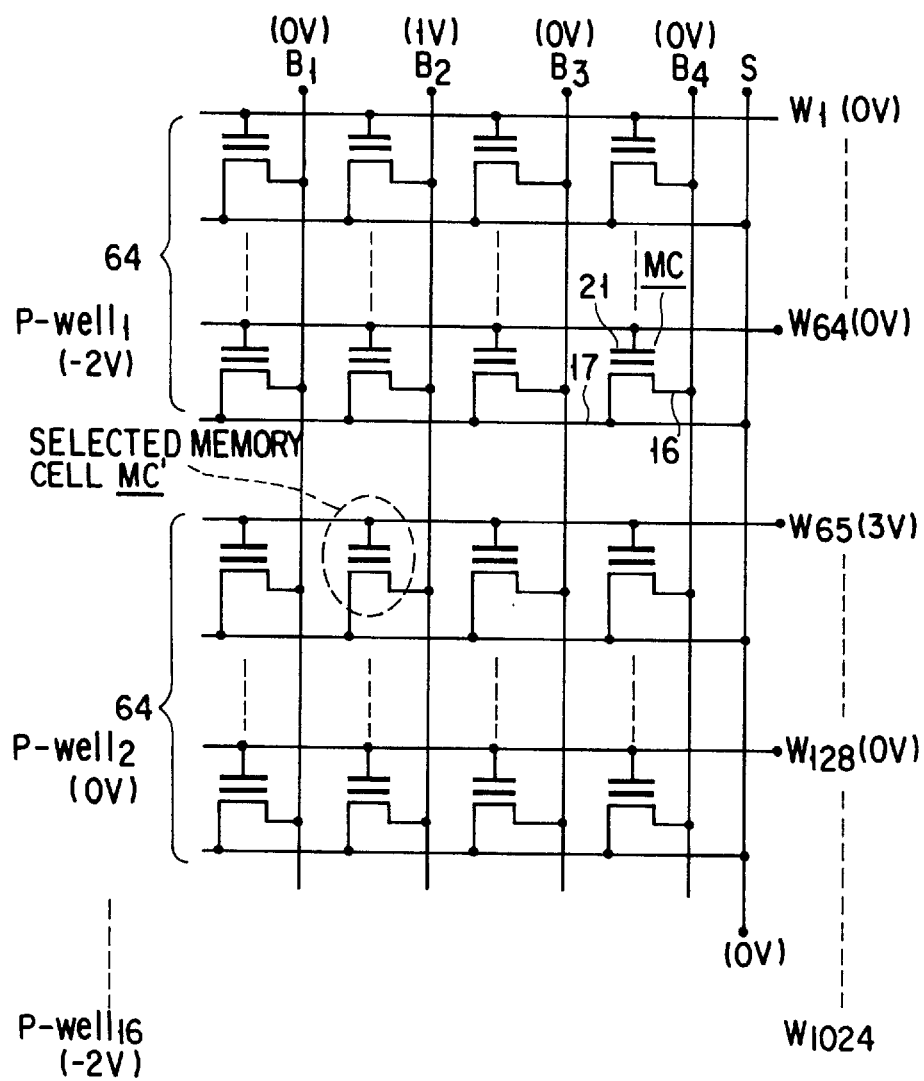
FIG. 3 is an equivalent circuit diagram of the constitution of a memory cell array of the nonvolatile semiconductor memory device shown in FIG. 2.

FIG. 3 illustrates an equivalent circuit of the memory cell array described above. The memory cell array includes 16 cell blocks corresponding to 16 P-type wells (P-well$_k$ (k=1 to 16): well group) 14, 4 bit lines $B_i$ (i=1 to 4: second wiring group), and 1024 word lines $W_j$ (j=1 to 1024: first wiring group). A memory cell MC is provided at each of intersections of bit lines $B_i$ and word lines $W_j$.

Each of the cell blocks is constituted of 64×4 memory cells MC, and a bias voltage applied to each of the cell blocks can be controlled independently by the bias circuit 31. The N-type drain diffusion layers 16 of 1024 memory cells MC are connected to the bit lines $B_i$. The control gate electrodes 21 of 4 memory cells MC are connected to the word lines $W_j$.

If the total number of memory cells MC is not changed, the present invention becomes more effective when the number of cell blocks is increased and the number of memory cells per unit of cell block is decreased. If, however, the number of cell blocks is increased, the ratio of element isolation regions (trenches 13) occupied in the memory cell array is increased and thus the degree of integration is lowered. Consequently, an adequate number of isolated regions are required though it has been described above that 10 or more regions are desirable.

Figure 4:
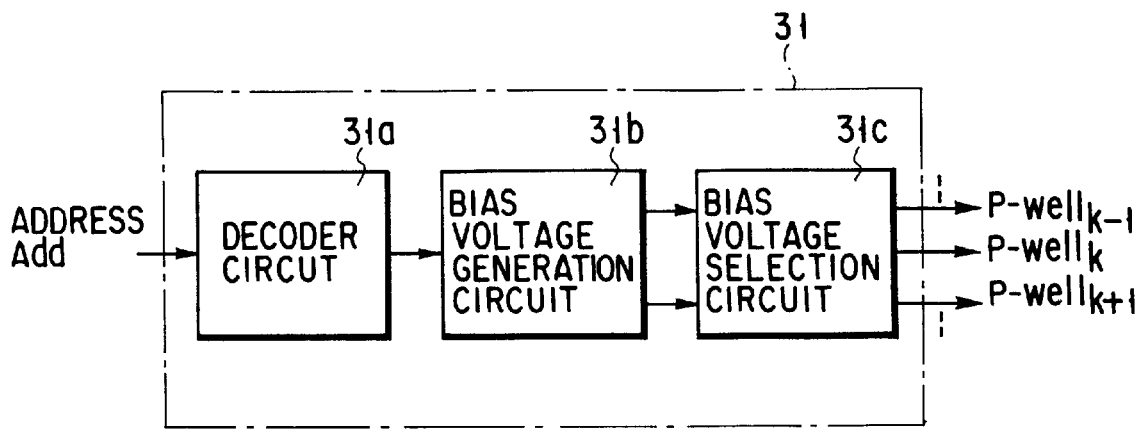
FIG. 4 is a block diagram showing an example of the arrangement of a bias circuit of the nonvolatile semiconductor memory shown in FIG. 2.

FIG. 4 illustrates an example of the constitution of the bias circuit 31 for applying a bias voltage to each of the cell blocks independently. The bias circuit 31 includes a decoder circuit 31a, a bias voltage generation circuit 31b and a bias voltage selection circuit 31c. For example, when information is read, a bias voltage, which differs from that applied to another cell block, can be applied to only the cell block including a selected memory cell MC' corresponding to address Add.

An operation of reading information will now be described. First the P-type silicon substrate 11 and N-type well 12 are set to a ground voltage (0V), and a voltage of, e.g., 3 V is applied to the control gate electrode (word line $W_{65}$ in FIG. 3) 21 of a memory cell (selected memory cell MC') from which information is to be read out, and a voltage of 0 V is applied to the control gate electrodes (word lines $W_1$ to $W_{64}$ and $W_{66}$ to $W_{1024}$) 21 of the other memory cells (non-selected memory cells). Moreover, a voltage of, e.g., 1V is applied to the N-type drain diffusion layer (bit line $B_2$ in FIG. 3) of the selected memory cell MC', and a voltage of 0 V is applied to the other N-type drain diffusion layers. The voltages of the N-type source diffusion layers (source lines S in FIG. 3) 17 of all the memory cells are set to 0V.

The voltage of the P-type well (P-well$_2$ in FIG. 3) 14 including the selected memory cell MC' is set to 0 V by the bias circuit 31. In this time, a voltage of, e.g., −2V is applied by the bias circuit 31 to P-type wells 14 not including the selected memory cell MC' or P-type wells (P-well$_k$ (k 2) in FIG. 3) 14 including only the non-selected memory cells.

Thus, a substrate bias voltage of −2V is applied to the P-type wells (P-well$_k$ (k 2) in FIG. 3) 14 including only the non-selected memory cells, and the threshold voltage of the non-selected memory cells is increased, thereby increasing the threshold voltage of 960 non-selected memory cells which are obtained by excluding 64 memory cells, which are formed on the P-type wells (P-well$_2$ in FIG. 3) 14 whose bias voltage is set to 0V, from 1024 memory cells connected to the bit line $B_2$. Since the threshold voltage of the non-selected memory cells is increased, the sub-threshold leak current (which flows from the N-type drain diffusion layer 16 to the N-type source diffusion layer 17 even when the voltage applied to the control gate electrode 21 is 0V) of the selected memory cell MC' can be decreased to a negligible degree. Of the 1024 memory cells connected to the bit line $B_2$, 960 memory cells are non-selected ones the threshold voltage of which is increased; therefore, even though the threshold voltage of the 1024 memory cells is set to a low value in the erase mode, the sub-threshold leak current flowing through the 960 non-selected memory cells in the read mode can be reduced to a negligible degree. In other words, according to the first embodiment, the sub-threshold leak current flowing through the 1024 memory cells connected to the bit line $B_2$ can be reduced to 64/1024 of that of the prior art device.

Figure 1:
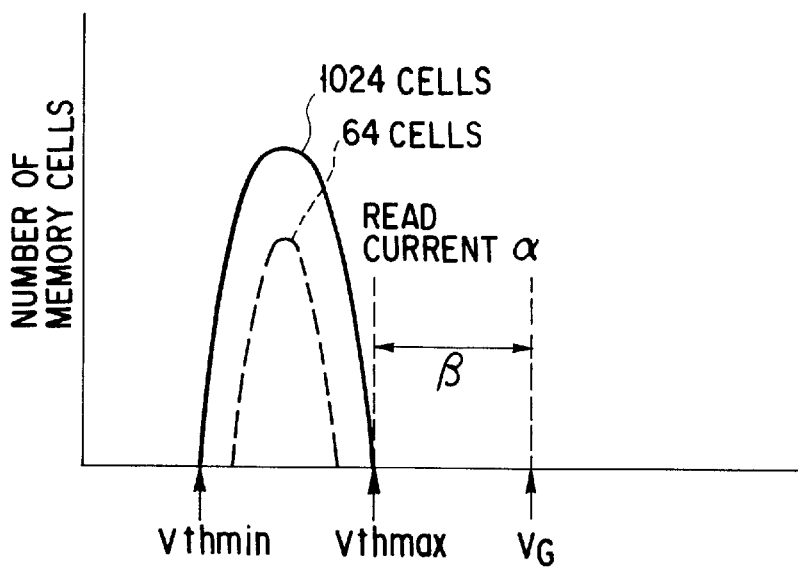
FIG. 1 is a graph showing the distribution of threshold voltages of memory cells of a memory cell array connected to one bit line after their erase operations are completed, in order to explain the prior art of the present invention and the problems thereof.

If the total number of memory cells per bit line $B_i$ is decreased, a difference between the threshold voltage Vthmax of the memory cell whose erase speed is the lowest and the threshold voltage Vthmin of the memory cell whose erase speed is the highest, is narrowed and a difference β between the gate voltage VG and threshold voltage Vthmax is broadened. If the difference β is broadened, a considerable amount of read current α is obtained even though the gate voltage VG is dropped (see FIG. 1). In other words, of 1024 memory cells connected to the bit line $B_2$, 960 memory cells are increased in threshold voltage in the read mode, which means that only 64 memory cells are virtually connected to the bit line $B_2$. Since, therefore, the difference β is broadened, a considerable amount of read current α is obtained even though the gate voltage VG is decreased.

Figure 5:
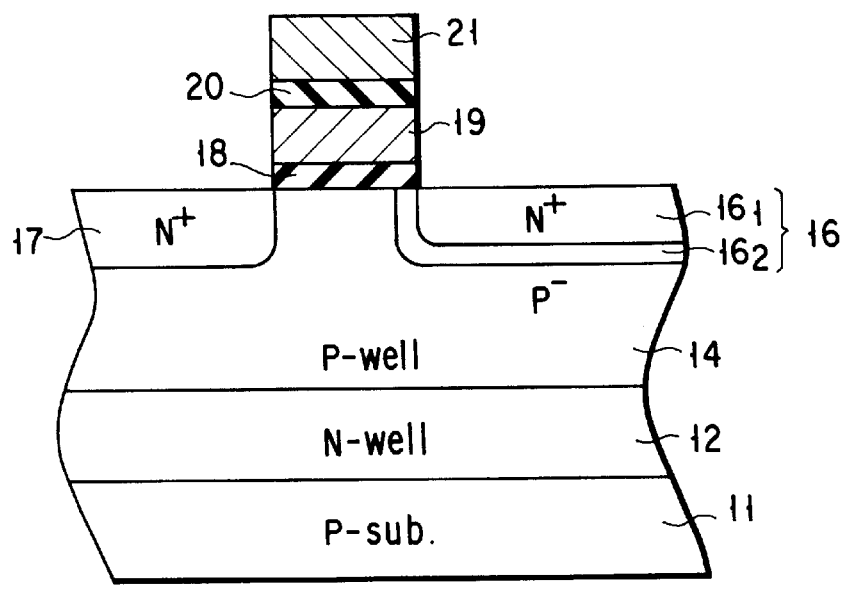
FIG. 5 is a schematic cross-sectional view of an example of the constitution of a memory cell.

As illustrated in FIG. 5, the N-type drain diffusion layer 16 is constituted of an N$^+$-type layer $16_1$ and a P$^-$-type layer (pocket region) $16_2$, which is formed so as to surround the N$^+$-type layer $16_1$ at least alongside the N-type source diffusion layer 17, in order to improve the withstanding voltage of the N-type drain diffusion layer. In this case, even though the junction capacitance of the N-type drain diffusion layer 16 is increased by the P$^-$-type layer $16_2$, access time is not lengthened greatly in the read mode. In other words, a substrate bias voltage is applied to the P-type well 14 including non-selected memory cells to increase a reverse bias between the N-type drain diffusion layer 16 and P-type well 14, and the junction capacitance of the N-type drain diffusion layer 16 and P-type well 14 is effectively reduced, with the result that the parasitic capacitance of the bit line $B_i$ connected to the N-type drain diffusion layer 16 can be decreased, and access time can be shortened.

When memory cells are formed on the P-type well 14, a large amount of current flows in a write operation performed by channel hot electrons and accordingly the potential of the P-type well 14 rises from 0V. Such a rise is likely to cause a problem of decreasing in write speed and breakdown voltage.

Figure 6A:
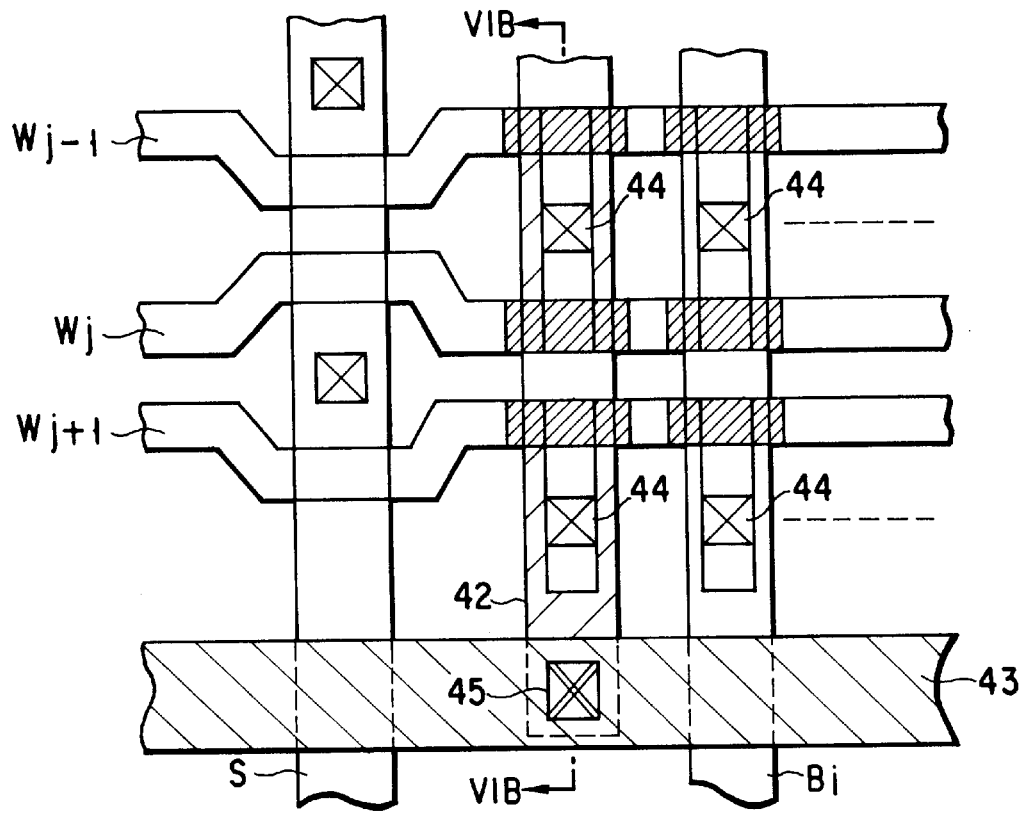
FIGS. 6A and 6B are a schematic plan view and a schematic cross-sectional view for explaining a metal wiring layer onto which the potential of a P-type well is fixed.
Figure 6B:
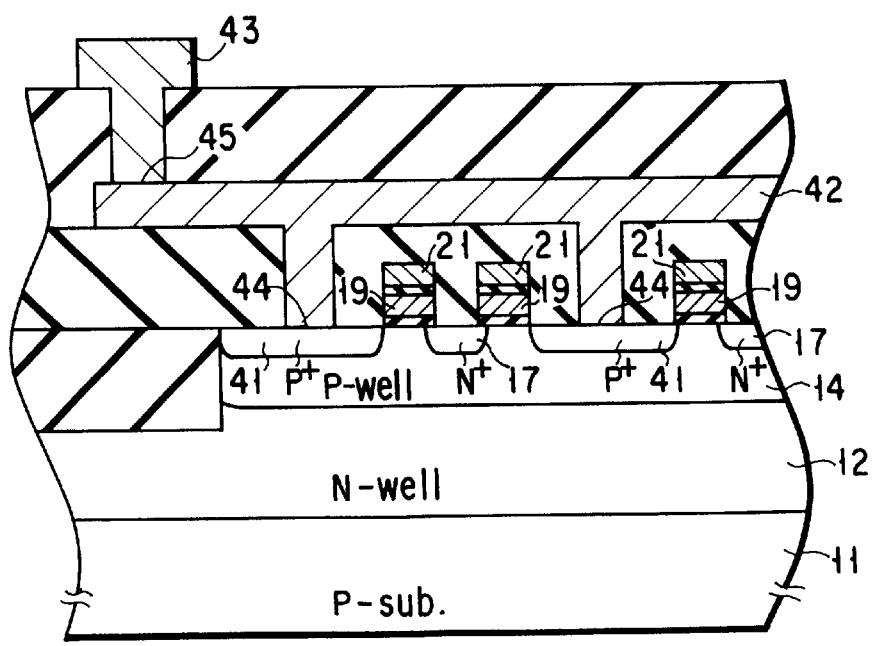

Such a problem can be resolved by forming a wiring layer set to a fixed potential and contacting the P-type well 14 at a plurality of points and then controlling and fixing the potential of the P-type well 14 by the fixed potential of the wiring layer. More specifically, as shown in FIGS. 6A and 6B, P-type impurity ions are implanted into that part of the P-type well 14 where the N-type drain diffusion layer is to be formed and then annealing the P-type well 14 to form P-type diffusion layers 41 of high impurity concentration. After that, metal wiring layers (first and second wiring layers) 42 and 43 having a fixed potential have only to be formed. A low-resistance wiring layer such as an Al wiring layer is used as the metal wiring layers 42 and 43.

The metal wiring layer 42 originally serves as the bit line $B_i$ adjacent to the Source Line S and its longitudinal direction is substantially parallel with that of the bit line $B_i$. If there are plural source lines S, one metal wiring layer 42 can be provided adjacent to each of the source lines S. The metal wiring layer 42 is connected to the bias circuit (decoder circuit) 31, as shown in FIG. 4, through the metal wiring layer 43 which is formed above the metal wiring layer 42 and substantially parallel with the longitudinal direction of the word line $W_j$.

The metal wiring layers 42 and 43 having a multi-layer wiring structure can thus be formed easily for each of the P-type wells 14, and the potentials of the P-type wells 14 can be controlled independently without causing a great potential gradient in the P-type well 14. In FIGS. 6A and 6B, reference numerals 44 and 45 denote a contact hole and a via hole, respectively.

In the foregoing first embodiment, the large P-type well layer is isolated into a plurality of P-type wells 14 by the trenches 13. The P-type wells 14 can be formed by diffusing P-type impurities using a mask having a plurality of openings corresponding to the P-type wells. However, the use of the trenches 13 is more desirable to decrease the area of isolated regions and enhance a degree of integration.

(Second Embodiment)

Figure 7:
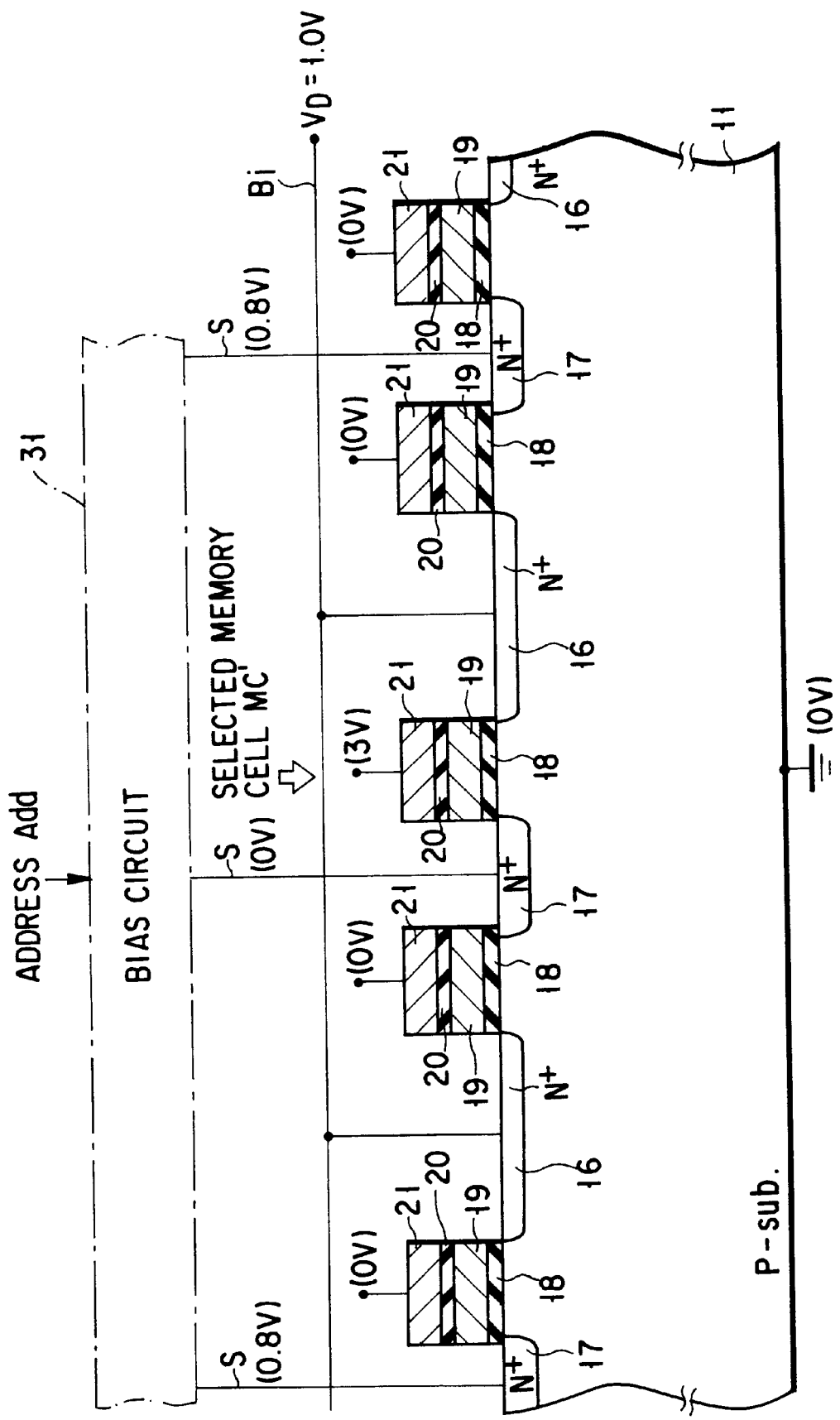
FIG. 7 is a schematic view showing the main part of the constitution of a nonvolatile semiconductor memory device according to a second embodiment of the present invention.

FIG. 7 schematically shows the constitution of the main part of a nonvolatile semiconductor memory device according to a second embodiment of the present invention. FIG. 7 is a cross-sectional view taken in a column (bit line) direction and showing the constitution of a memory cell array of the device. The constituting elements corresponding to those of the memory cell array shown in FIG. 2 are indicated by the same reference numerals and their detailed descriptions are omitted.

In the first embodiment, the N-type drain and source diffusion layers 16 and 17 are formed in the surface region of the P-type well 14 and the source line S common to all the N-type source diffusion layers 17 is formed. In the second embodiment, however, N-type drain and source diffusion layers 16 and 17 are formed in the surface region of a P-type silicon substrate 11 and an independent source line (third wiring group) S is formed for each of the N-type source diffusion layers 17.

These plural source lines S can be achieved by the multilayer wiring structure. In other words, an interlayer insulation film (not shown) has only to be formed on a bit line $B_i$ to form source lines S in a direction substantially perpendicular to the bit line $B_i$. More specifically, a metal wiring layer of the second layer, which is substantially parallel with the N-type source diffusion layer 17 extending in the direction of word lines $W_j$, has only to be formed as a source line S above the layer 17, by the SAS (self-aligned source) process to connect the source line S and N-type source diffusion layer 17 each other through a metal wiring layer of the first layer at the same, level as that of the contact and bit lines $B_i$.

In the first embodiment, a substrate bias voltage is controlled for each of the P-type wells 14. In the second embodiment, an independent source line S is formed for each of the N-type source diffusion layers 17; thus, a substrate bias voltage is controlled for each of the layers 17.

In the above constitution of the second embodiment, if, in the read mode, only the voltage of the N-type source diffusion layer 17 of a selected memory cell MC' is set at the same ground voltage (0V) as that of the P-type silicon substrate 11 by the use of the above bias circuit 31 shown in FIG. 4 and the voltage of the other N-type source diffusion layers 17 is set at about 0.8V, the N-type source diffusion layers 17 of all non-selected memory cells except the selected memory cell MC' and the non-selected memory cells sharing both the selected memory cell MC' and N-type source diffusion layer 17, and P-type silicon substrate can be biased reversely.

Accordingly, the threshold voltages of all non-selected memory cells except the selected memory cell MC' and non-selected memory cells sharing both the selected memory cell MC' and N-type source diffusion layer 17, can be heightened. Consequently, according to the second embodiment, the leak current of all non-selected memory cells except the selected memory cell MC' and non-selected memory cells sharing both the selected memory cell MC' and N-type source diffusion layer 17, can be reduced to a negligible degree, and a greater effect can be expected than that of the first embodiment.

(Third Embodiment)

Figure 8:
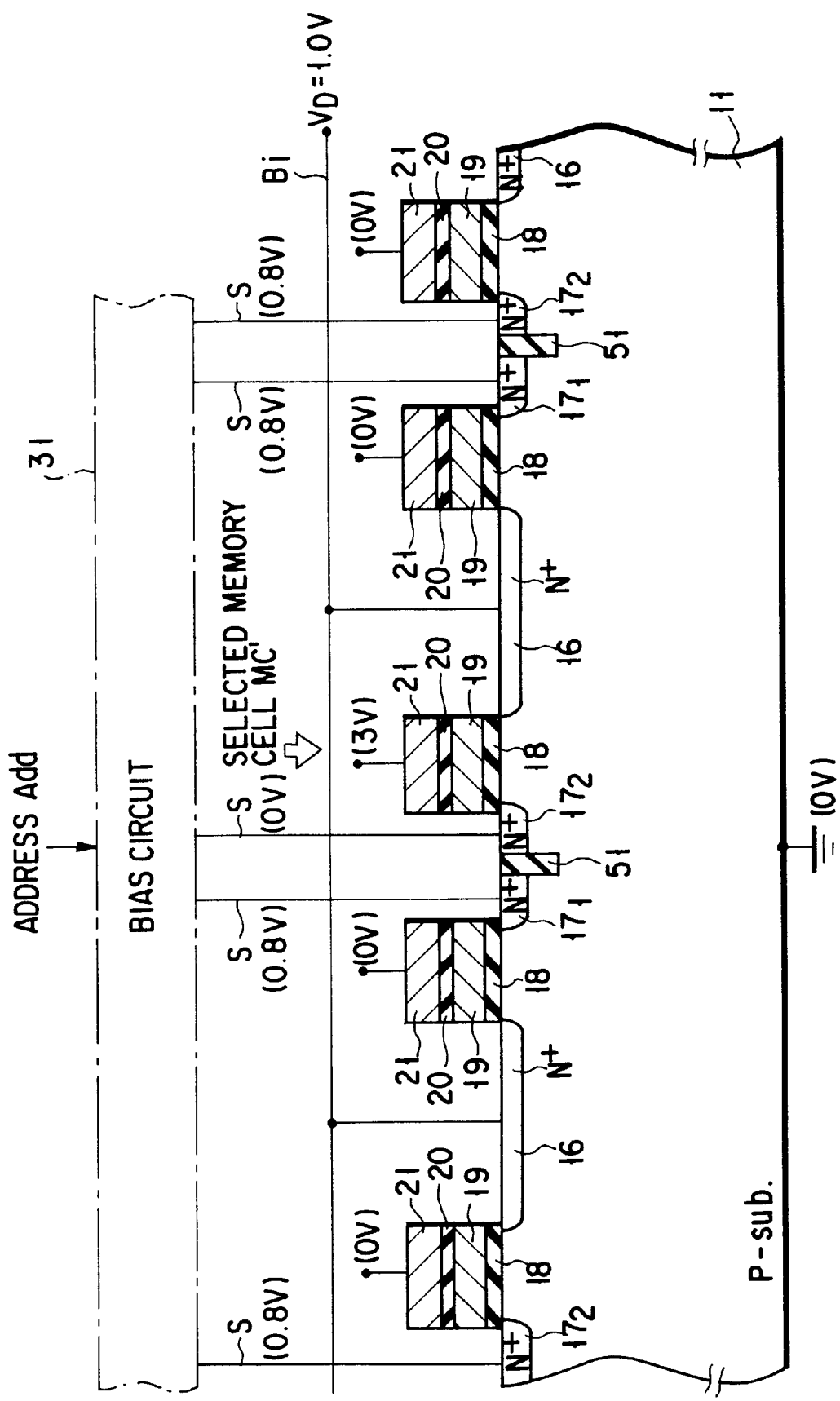
FIG. 8 is a schematic view showing the constitution of the main part of a nonvolatile semiconductor memory device according to a third embodiment of the present invention.

FIG. 8 schematically shows the constitution of the main part of a nonvolatile semiconductor memory device according to a third embodiment of the present invention. FIG. 8 is a cross-sectional view taken in a column (bit line) direction and showing the constitution of a memory cell array of the device. The memory cell array of the third embodiment is an improvement of that of the second embodiment. The constituting elements corresponding to those of the second embodiment are indicated by the same reference numerals and their detailed descriptions are omitted.

According to the third embodiment, the N-type source diffusion layer 17 shown in FIG. 7 is separated into two N-type source diffusion layers $17_1$ and $17_2$ by a trench type insulation film 51 to control the voltages of these layers $17_1$ and $17_2$ independently. More specifically, a source line S is connected to each of the N-type source diffusion layers $17_1$ and $17_2$ such that the voltages of the source lines S can be applied to the layers $17_1$ and $17_2$ independently using the bias circuit (source decoder circuit) 31 illustrated in FIG. 4, with the result that the voltages of the layers $17_1$ and $17_2$ are controlled independently.

By controlling the voltages of the layers $17_1$ and $17_2$ independently, the threshold voltages of all non-selected memory cells except a selected memory cell MC' can be increased. Consequently, according to the third embodiment, the leak current of all non-selected memory cells except the selected memory cell MC' can be reduced to a negligible degree, and a greater effect can be expected than that of the second embodiment.

A method of forming a memory cell array in which an N-type source diffusion layer is separated into two layers by a trench, will now be described with reference to the cross-sectional views of FIGS. 9A to 9C and the plan views of FIGS. 10A and 10B.

Figure 9A:
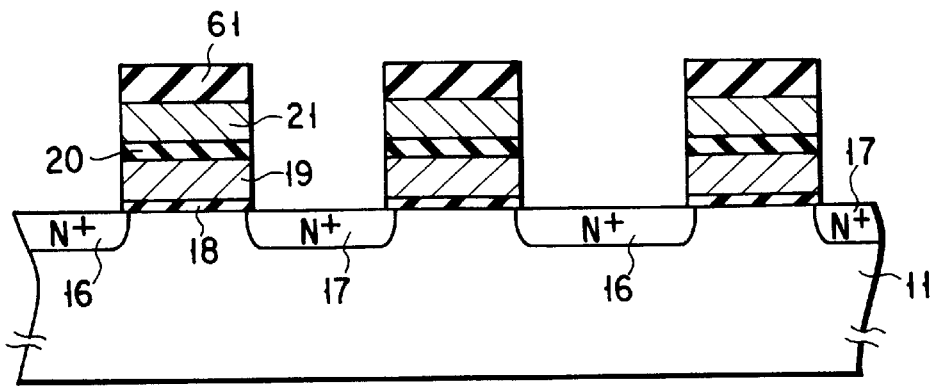
FIGS. 9A to 9C are schematic cross-sectional views illustrating a separation process of a source diffusion layer in a memory cell array of the nonvolatile semiconductor memory device shown in FIG. 8.

As illustrated in FIG. 9A, a gate electrode section having a stacked gate structure including a gate insulation film (tunnel oxide film) 18, a floating gate electrode 19, a gate-to-electrode insulation film 20 and a control gate electrode 21, and a cap insulation film 61 are formed on a P-type silicon substrate 11. N-type impurity ions are implanted into the substrate 11 from the surface using the cap insulation film 61 as a mask, and then the resultant structure is annealed to form N-type drain and source diffusion layers 16 and 17 of high impurity concentration in self-alignment. The process described so far is the same as that of manufacturing a normal flash memory.

Figure 9B:
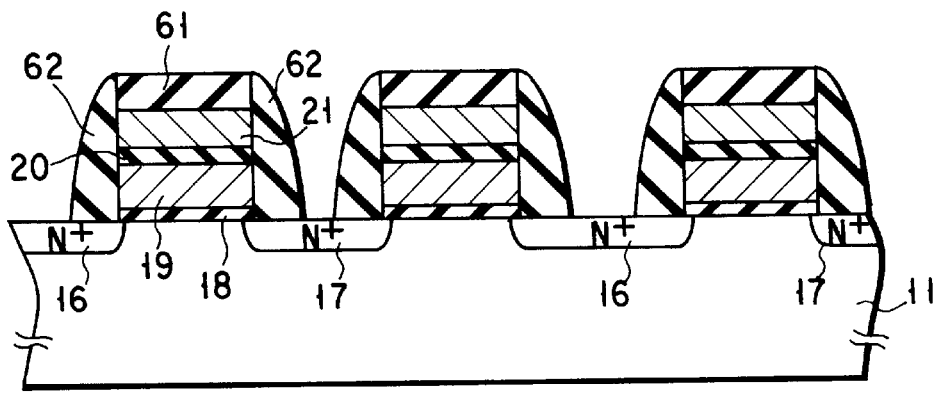

As shown in FIG. 9B, an insulation film is formed on the entire surface of the resultant structure and etched by RIE (reactive ion etching) to form a gate sidewall insulation film 62 on the sidewall of the gate electrode section as a so-called sidewall remainder.

Figure 9C:
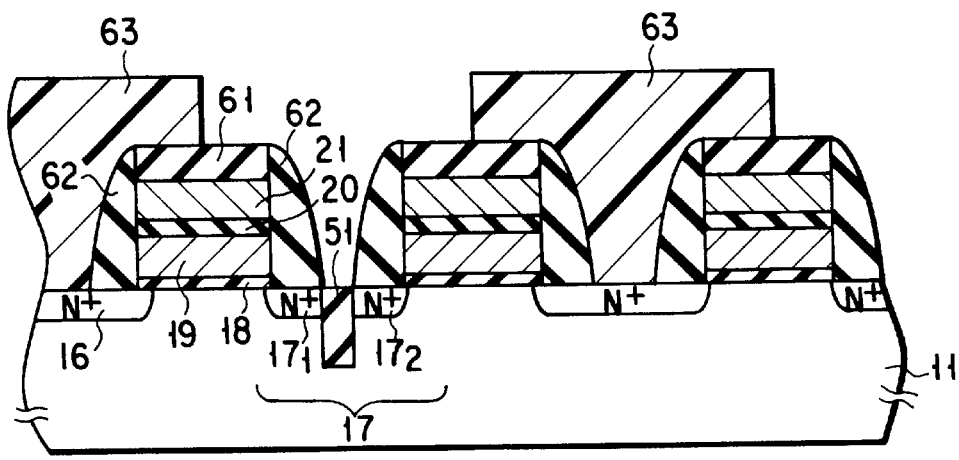

Referring to FIG. 9C, a resist pattern 63 is formed in which the N-type source diffusion layer 17 and gate sidewall insulation film 62 formed thereon are exposed, and the N-type source diffusion layer 16 and gate sidewall insulation film 62 are coated. Using the gate sidewall insulation film 62 and cap insulation film 61, which are exposed from the resist pattern 63 and N-type source diffusion layer 17, as a mask, the N-type source diffusion layer 17 and P-type silicon substrate 11 are etched and then an insulation film is buried to form a trench type insulation film 51 in substantially the central part of the layer 17 and separate the layer 17 into two N-type source diffusion layers $17_1$ and $17_2$.

Usually the N-type source diffusion layer 17 in a region where a source contact section is formed, is formed more widely than those in the other regions. In this wide region, therefore, as shown in FIGS. 10A and 10B, the N-type source diffusion layer 17 is separated not into halves but into N-type source diffusion layers $17_1$ and $17_2$ having different widths.

Figure 11A:
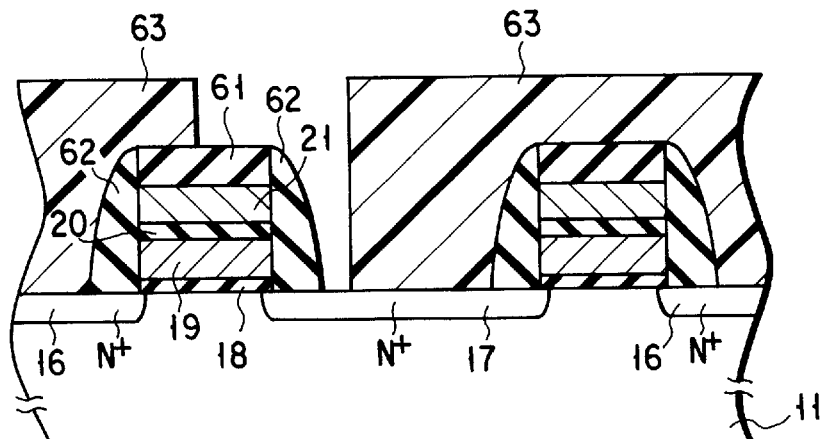
FIGS. 11A to 11C are schematic cross-sectional views explaining a method for forming a source line in the memory cell of the nonvolatile semiconductor memory device shown in FIG. 8.

A method of forming a source line S connected to each of the N-type source diffusion layers $17_1$ and $17_2$ will now be described with reference to FIGS. 11A to 11C.

Usually the N-type source diffusion layer 17 in a region where a source contact section is formed, is formed more widely than those in the other regions (where no source contact section is formed). As described above, in the wide region, the N-type source diffusion layer 17 is not separated into halves, but a resist pattern 63 is formed on part of the N-type source diffusion layer 17 as shown in FIGS. 10A and 11A. When a source contact section is formed in the N-type source diffusion layer $17_2$, the width of the layer $17_2$ is set greater than that of the layer $17_1$.

Figure 11B:
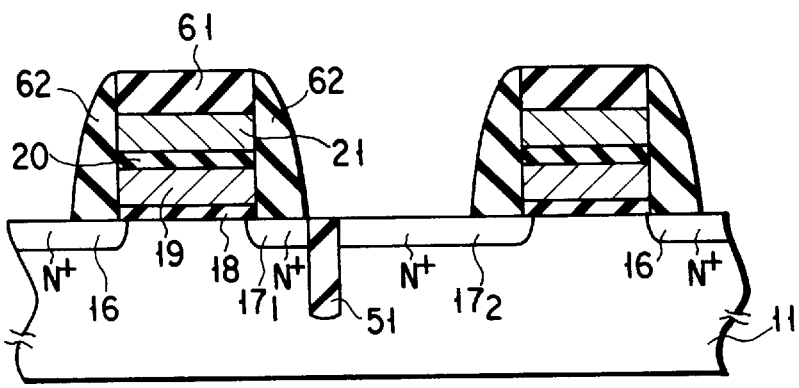
Figure 11C:
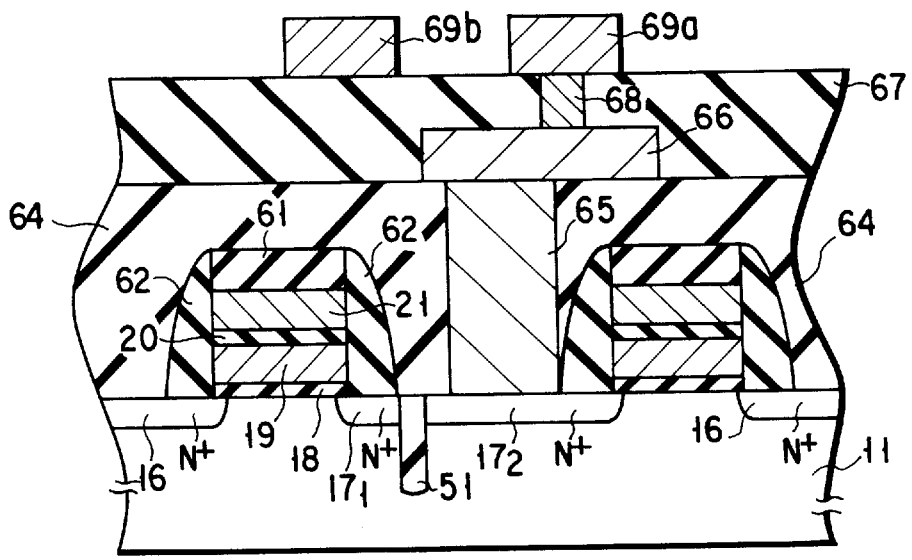

The resist pattern 63 is removed as shown in FIGS. 10B and 11B and then a first interlayer insulation film 64 is formed on the entire surface of the resultant structure as shown in FIG. 11C. After that, a contact hole connected to the N-type source diffusion layer $17_2$ is formed in the interlayer insulation film 64. A first plug 65 is formed in the contact hole and then a first source line 66 connected to the first plug 65 is formed.

After a second interlayer insulation film 67 is formed, a via hole connected to the first source line 66 is formed in the film 67. A second plug 68 is formed in the via hole and then a second source line 69a connected to the second plug 68 is formed. The second source line 69a extends substantially parallel with the longitudinal direction of the word line Wj and is connected to a source decoder circuit (not shown) such as the bias circuit 31 shown in FIG. 4.

When a source contact section is formed in the N-type source diffusion layer $17_1$, the width of the layer $17_1$ is set greater than that of the layer $17_2$, and the second source wiring layer 69b is formed through the above process.

Thus, the contact sections in the N-type source diffusion layers $17_1$ and $17_2$ have only to cross each other in the row direction (longitudinal direction of word line Wj).

In the foregoing embodiments, the N-channel memory cell can be replaced with a P-channel memory cell. In this case, the conductivity type and the bias polarity have only to be reversed.

It is needless to say that various changes and modifications can be made without departing from the scope of the subject matter of the present invention.

In the above-described nonvolatile semiconductor memory device according to the present invention, even though the threshold voltage of a memory cell is set to a low value in the erase mode, the threshold voltages of some or all of non-selected memory cells are increased in the read mode. The leak current, which flows through the non-selected memory cells connected to the same wiring as that connected to a selected memory cell, can thus be reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a plurality of wells formed on a surface of a semiconductor substrate;
   a plurality of electrically erasable memory cells formed in a matrix, a predetermined number of said plurality of electrically erasable memory cells being formed in each of said wells, and each of said plurality of electrically erasable memory cells having a source electrode, a drain electrode and a stacked gate structure in which a control gate electrode and an electric charge storage layer are formed;
   a plurality of first wirings each connected in common to the control gate electrodes of a predetermined number of said plurality of electrically erasable memory cells;
   a plurality of second wirings each connected in common to the drain electrodes of a predetermined number of said plurality of electrically erasable memory cells; and
   a bias circuit applying a reverse bias voltage to said wells other than that on which a selected electrically erasable memory cell is formed in a reading operation.

2. The nonvolatile semiconductor memory device according to claim 1, wherein the plurality of wells are electrically isolated from each other by trenches formed substantially perpendicularly to a longitudinal direction of the second wirings.

3. The nonvolatile semiconductor memory device according to claim 1, wherein the bias circuit controls potentials of the plurality of wells independently.

4. The nonvolatile semiconductor memory device according to claim 1, wherein the plurality of wells are connected to the bias circuit through a multilayer wiring constituted of a first-layer wiring substantially parallel with the longitudinal direction of the second wires and a second-layer wiring formed above the first-layer wiring and substantially parallel with a longitudinal direction of the first wirings in order to control the potentials of the plurality of wells independently.

5. The nonvolatile semiconductor memory device according to claim 1, wherein a well having a conductivity type different from those of said wells is formed on the surface of said semiconductor substrate.

6. The nonvolatile semiconductor memory device according to claim 1, wherein said source electrodes are constituted of source diffusion layers, said drain electrodes are constituted of drain diffusion layers, and pocket regions having a conductivity type different from those of said drain diffusion layers are formed at least alongside said source diffusion layers so as to surround said drain diffusion layers.

7. The nonvolatile semiconductor memory device according to claim 1, further comprising a wiring layer for controlling/fixing potentials of said wells, said wiring layer having a constant potential and being in contact with said wells at a plurality of points.

8. A nonvolatile semiconductor memory device comprising:
   a semiconductor substrate;
   a plurality of electrically erasable memory cells formed on a surface of said semiconductor substrate in a matrix, each of said plurality of electrically erasable memory cells having a source electrode, a drain electrode and a stacked gate structure in which a control gate electrode and an electric charge storage layer are formed;
   a plurality of first wirings each connected in common to the control gate electrodes of a predetermined number of said plurality of electrical erasable memory cells;
   a plurality of second wirings each connected in common to the drain electrodes of a predetermined number of said plurality of electrically erasable memory cells;
   a plurality of third wirings each connected to the corresponding source electrodes of said plurality of electrically erasable memory cells; and
   a bias circuit applying a reverse bias voltage to the source electrodes other than that of a selected electrically erasable memory cell via said third wirings in a reading operation.

9. The nonvolatile semiconductor memory device according to claim 8, wherein the source electrodes are constituted of source diffusion layers extending in a direction substantially parallel with a longitudinal direction of the first wirings, and the third wirings are each connected to a corresponding source diffusion layer.

10. A nonvolatile semiconductor memory device comprising:
    a semiconductor substrate;
    a plurality of electrically erasable memory cells formed on a surface of said semiconductor substrate in a matrix, each of said plurality of electrically erasable memory cells having a source electrode, a drain electrode and a stacked gate structure in which a control gate electrode and an electric charge storage layer are formed;

a plurality of first wirings each connected in common to the control gate electrodes of a predetermined number of said plurality of electrically erasable memory cells;

a plurality of second wirings each connected in common to the drain electrodes of a predetermined number of said plurality of electrically erasable memory cells;

a plurality of third wirings each connected to the corresponding source electrodes of said plurality of electrically erasable memory cells; and a bias circuit applying a same voltage as that of said semiconductor substrate to a source electrode of a selected electrically erasable memory cell and a voltage for reversely biasing said source electrode and said semiconductor substrate to the source electrodes other than that of the selected electrically erasable memory cell said voltages being applied via said third wirings in a reading operation.

11. The nonvolatile semiconductor memory device according to claim 10, wherein the source electrodes are constituted of source diffusion layers extending in a direction substantially parallel with a longitudinal direction of the first wirings, and the source diffusion layers are separated for each of memory cells common to the second wirings.

12. The nonvolatile semiconductor memory device according to claim 11, wherein the source diffusion layers of adjacent two memory cells in a longitudinal direction of the second wirings are isolated by a trench.

13. A nonvolatile semiconductor memory device comprising:

a semiconductor substrate; and a plurality of electrically erasable memory cells formed on a surface of said semiconductor substrate, each of said plurality of electrically erasable memory cells having a source electrode, a drain electrode and a stacked gate structure in which a control gate electrode and an electric charge storage layer are formed, said source electrode comprising a source diffusion layer which is formed on a surface portion of said semiconductor substrate between two adjacent electrically erasable memory cells, and partitioned into regions electrically separated from each other by a trench having a greater depth that a depth of said source diffusion layer.

14. A nonvolatile semiconductor memory device comprising:

a semiconductor substrate; and a plurality of electrically erasable memory cells formed on a surface of said semiconductor substrate, each of said plurality of electrically erasable memory cells having a source electrode, a drain electrode and a stacked gate structure in which a control gate electrode and an electric charge storage layer are formed, said source electrode comprising a source diffusion layer which is formed on a surface portion of said semiconductor substrate between two adjacent electrically erasable memory cells, and partitioned into regions electrically separated from each other by a trench having a greater depth than a depth of said source diffusion layer and said source electrode being separated by said trench having a region which forms a contact portion with respect to a wiring connected to said source electrode and is larger than a region which does not form a contact region.

15. A nonvolatile semiconductor memory device comprising:

a semiconductor substrate;

a plurality of electrically erasable memory cells formed on a surface of said semiconductor substrate, each of said plurality of electrically erasable memory cells having a source electrode, a drain electrode and a stacked gate structure in which a control gate electrode and an electric charge storage layer are formed, said source electrode being separated by a trench formed on a surface portion of said semiconductor substrate between two adjacent electrically erasable memory cells of said plurality of electrically erasable memory cells;

a plurality of first wings each connected in common to the control gate electrodes of a predetermined number of said plurality of electrically erasable memory cells;

a plurality of second wirings each connected in common to the drain electrodes of a predetermined number of said plurality of electrically erasable memory cells;

a plurality of third wirings each connected to the corresponding source electrodes of said plurality of electrically erasable memory cells; and a bias circuit applying a reverse bias voltage to the source electrodes other than that of a selected electrically erasable memory cell via said third wirings in a reading operation.

16. A nonvolatile semiconductor memory device comprising:

a semiconductor substrate;

a plurality of electrically erasable memory cells formed on a surface of said semiconductor substrate, each of said plurality of electrically erasable memory cells having a source electrode, a drain electrode and a stacked gate structure in which a control gate electrode and an electric charge storage layer are formed, said source electrode being separated by a trench formed on a surface portion of said semiconductor substrate between two adjacent electrically erasable memory cells and said source electrode being separated by said trench having a region which forms a contact portion with respect to a wiring connected to said source electrode and is larger than a region which does not form a contact region;

a plurality of first wirings each connected in common to the control gate electrodes of a predetermined number of said plurality of electrically erasable memory cells;

a plurality of second wirings each connected in common to the drain electrodes of a predetermined number of said plurality of electrically erasable memory cells;

a plurality of third wirings each connected to the corresponding source electrodes of said plurality of electrically erasable memory cells; and a bias circuit applying a reverse bias voltage to the source electrodes other than that of a selected electrically erasable memory cell via said third wirings in a reading operation.

* * * * *